US009331248B2

(12) United States Patent
Masunaga et al.

(10) Patent No.: US 9,331,248 B2
(45) Date of Patent: May 3, 2016

(54) SEMICONDUCTOR LIGHT EMITTING DEVICE AND METHOD FOR MANUFACTURING THE SAME

(71) Applicant: Kabushiki Kaisha Toshiba, Minato-ku (JP)

(72) Inventors: Kumi Masunaga, Kanagawa-ken (JP); Ryota Kitagawa, Tokyo (JP); Akira Fujimoto, Kanagawa-ken (JP); Koji Asakawa, Kanagawa-ken (JP); Takanobu Kamakura, Fukuoka-ken (JP); Shinji Nunotani, Fukuoka-ken (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/543,942

(22) Filed: Nov. 18, 2014

(65) Prior Publication Data
US 2015/0072456 A1 Mar. 12, 2015

Related U.S. Application Data

(62) Division of application No. 13/221,319, filed on Aug. 30, 2011, now Pat. No. 8,921,887.

(30) Foreign Application Priority Data

Mar. 3, 2011 (JP) .................................. 2011-46267

(51) Int. Cl.
*H01L 21/00* (2006.01)
*H01L 33/40* (2010.01)
*H01L 33/38* (2010.01)

(52) U.S. Cl.
CPC .............. *H01L 33/405* (2013.01); *H01L 33/38* (2013.01); *H01L 2933/0016* (2013.01); *H01L 2933/0083* (2013.01)

(58) Field of Classification Search
CPC .................................................. H01L 51/0023
USPC .............. 438/29, 570; 257/E33.007, E33.055
See application file for complete search history.

(56) References Cited

U.S. PATENT DOCUMENTS 6,258,618 B1   7/2001   Lester
6,486,500 B1   11/2002  Chen
(Continued)

FOREIGN PATENT DOCUMENTS

JP    4-306885    10/1992
JP    10-256602   9/1998
(Continued)

OTHER PUBLICATIONS

Su et al.,"GaN and InGaN Metal-Semiconductor-Metal Photodetectors with Different Schottky Contact Metals", Jpn. J. Appl. Phys. vol. 40 (2001) pp. 2996-2999.*
(Continued)

*Primary Examiner* — Julia Slutsker
(74) *Attorney, Agent, or Firm* — Oblon, McClelland, Maier & Neustadt, L.L.P.

(57) ABSTRACT

According to one embodiment, a semiconductor light emitting device includes a first semiconductor layer of a first conductivity type, a second semiconductor layer of a second conductivity type and a light emitting layer provided between the first semiconductor layer and the second semiconductor layer. The device also includes a first electrode layer having electrical continuity with the first semiconductor layer and a second electrode layer provided on the second semiconductor layer, the second electrode layer including a metal portion having a thickness not less than 10 nanometers and not more than 100 nanometers along a direction from the first semiconductor layer to the second semiconductor layer. A plurality of apertures penetrates the metal portion along the direction, each of the apertures viewed along the direction having equivalent circle diameters of not less than 10 nanometers and not more than 5 micrometers, and a Schottky barrier is provided between the second semiconductor layer and the metal portion.

12 Claims, 9 Drawing Sheets

(56) References Cited

U.S. PATENT DOCUMENTS

| | | |
|---|---|---|
| 6,730,934 B2 | 5/2004 | Yamada et al. |
| 8,680,561 B2 | 3/2014 | Kitagawa et al. |
| 8,835,954 B2 | 9/2014 | Fujimoto et al. |
| 8,853,711 B2 | 10/2014 | Fujimoto et al. |
| 2003/0141507 A1* | 7/2003 | Krames et al. ............. 257/79 |
| 2006/0237739 A1 | 10/2006 | Shono et al. |
| 2007/0194357 A1* | 8/2007 | Oohashi et al. ........... 257/292 |
| 2008/0042563 A1* | 2/2008 | Niigaki et al. ............. 313/542 |
| 2009/0079322 A1 | 3/2009 | Tsutsumi et al. |
| 2009/0153866 A1* | 6/2009 | Yamamichi et al. ....... 356/445 |
| 2009/0211783 A1 | 8/2009 | Tsutsumi et al. |
| 2009/0236962 A1 | 9/2009 | Fujimoto et al. |
| 2009/0242925 A1 | 10/2009 | Kitagawa et al. |
| 2010/0175749 A1 | 7/2010 | Tsutsumi et al. |
| 2010/0183866 A1 | 7/2010 | Fujimoto et al. |
| 2010/0220757 A1 | 9/2010 | Kitagawa et al. |
| 2010/0236619 A1 | 9/2010 | Tsutsumi et al. |
| 2010/0236620 A1 | 9/2010 | Nakanishi et al. |
| 2011/0049556 A1 | 3/2011 | Fujimoto et al. |
| 2011/0220936 A1 | 9/2011 | Fujimoto et al. |
| 2011/0233602 A1 | 9/2011 | Hwang |
| 2012/0042946 A1 | 2/2012 | Masunaga et al. |
| 2012/0056155 A1 | 3/2012 | Asakawa et al. |
| 2012/0061640 A1 | 3/2012 | Kitagawa et al. |
| 2012/0061712 A1 | 3/2012 | Masunaga et al. |
| 2012/0073651 A1 | 3/2012 | Fujimoto et al. |
| 2012/0223355 A1 | 9/2012 | Asakawa et al. |

FOREIGN PATENT DOCUMENTS

| | | |
|---|---|---|
| JP | 2000-174339 | 6/2000 |
| JP | 2002-033512 | 1/2002 |
| JP | 2004-111648 | 4/2004 |
| JP | 2004-119839 | 4/2004 |
| JP | 2005-39264 | 2/2005 |
| JP | 2006-245379 | 9/2006 |
| JP | 2007-123446 | 5/2007 |
| JP | 2008-60331 | 3/2008 |
| JP | 2008-263023 | 10/2008 |
| JP | 2009-231689 | 10/2009 |
| JP | 2010-520640 | 6/2010 |
| JP | 2010-219399 | 9/2010 |
| WO | WO 2010/131680 A1 | 11/2010 |

OTHER PUBLICATIONS

Office Action issued Mar. 26, 2013 in Japanese Patent Application No. 2011-046267 (w/English language translation).

Office Action issued Jun. 19, 2013, in Japanese Patent Application No. 2011-046267 (w/English translation).

* cited by examiner

SEMICONDUCTOR LIGHT EMITTING DEVICE AND METHOD FOR MANUFACTURING THE SAME

CROSS-REFERENCE TO RELATED APPLICATION

This application is a division of and claims the benefit of priority under 35 U.S.C. §120 from U.S. Ser. No. 13/221,319 filed Aug. 30, 2011, and claims the benefit of priority under 35 U.S.C. §120 from Japanese Patent Application No. 2011-46267 filed Mar. 3, 2011; the entire contents of each of which are incorporated herein by reference.

FIELD

Embodiments described herein relate generally to a semiconductor light emitting device and a method for manufacturing the same.

BACKGROUND

Semiconductor light emitting device includes electrodes on the surface of semiconductor layers. A semiconductor light emitting device emits light by passing a current through these electrodes. For use of lighting equipments and the like, a relatively large light emitting device is desired. Therefore, a semiconductor light emitting device, wherein a fine wire electrode is added extending from a pad electrode along the surface of the semiconductor layer, can be considered. Also, a semiconductor light emitting device wherein a metal electrode layer is applied to all light emitting surfaces, and nanometer (nm) scale micro apertures are formed on the metal electrode layer can be considered. In these semiconductor light emitting devices, further uniformity of brightness is required.

DETAILED DESCRIPTION

Figure 1:
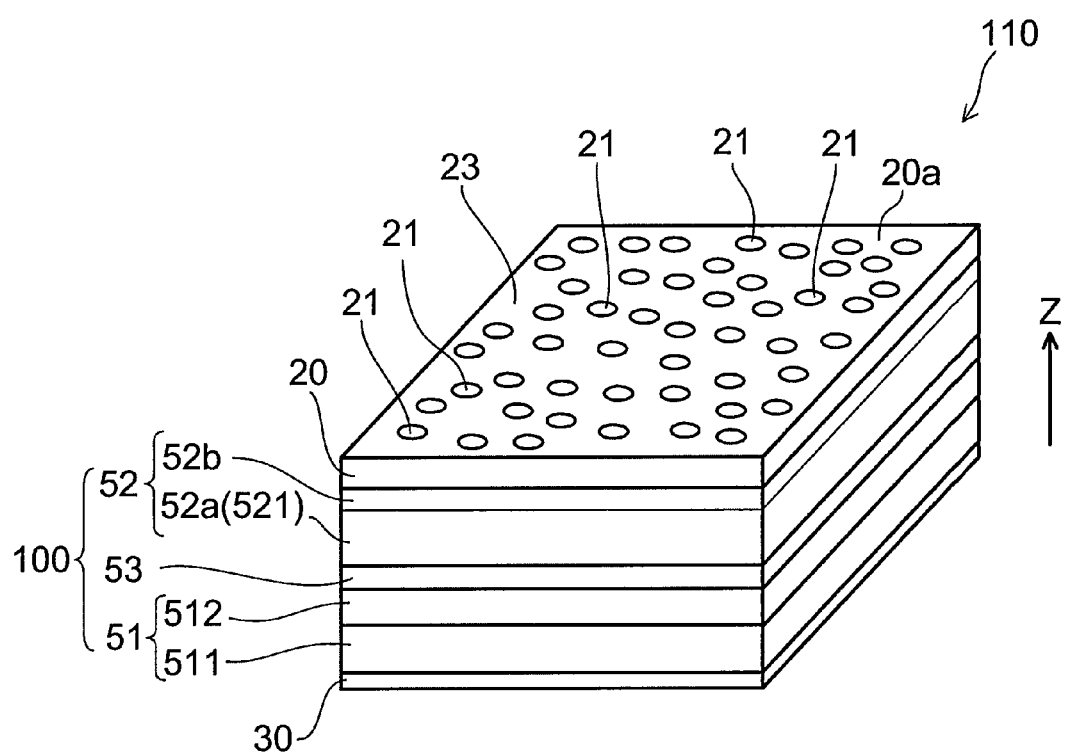
FIG. 1 is a schematic perspective view illustrating a semiconductor light emitting.

In general, according to one embodiment, a semiconductor light emitting device includes a first semiconductor layer of a first conductivity type, a second semiconductor layer of a second conductivity type and a light emitting layer provided between the first semiconductor layer and the second semiconductor layer. The semiconductor light emitting device also includes a first electrode layer having electrical continuity with the first semiconductor layer and a second electrode layer provided on the second semiconductor layer, the second electrode layer including a metal portion having a thickness not less than 10 nanometers and not more than 100 nanometers along a direction from the first semiconductor layer to the second semiconductor layer. A plurality of apertures penetrates the metal portion along the direction, each of the apertures viewed along the direction having equivalent circle diameters of not less than 10 nanometers and not more than 5 micrometers, and a Schottky barrier is provided between the second semiconductor layer and the metal portion.

A method for manufacturing a semiconductor light emitting device includes forming a structure including a first semiconductor layer of a first conductivity type, a second semiconductor layer of a second conductivity type, and a light emitting layer provided between the first semiconductor layer and the second semiconductor layer. The method also includes forming a metal layer on the second semiconductor layer with a thickness not less than 10 nanometers and not more than 100 nanometers along a direction from the first semiconductor layer toward the second semiconductor layer, and a Schottky barrier is formed between the metal layer and the second semiconductor layer. Further, the method includes forming a mask pattern on the metal layer and forming an electrode layer having a plurality of apertures with equivalent circle diameters not less than 10 nanometers and not more than 5 micrometers when viewed along the direction by etching the metal layer using the mask pattern as a mask.

Embodiments will now be described with reference to the drawings.

Note that the drawings are schematic or conceptual in nature, and relationships between thicknesses and widths of each portion, ratios between sizes of portions and the like are not therefore necessarily identical to the actual relationships and ratios. Also, even where identical portions are depicted, dimensions and ratios may appear differently depending on the drawing.

Further, in the drawings and specification of this application, the same numerals are applied to elements that have already appeared in the drawings and been described, and repetitious detailed descriptions of such elements are omitted.

Also, in the following explanation, examples are given as examples wherein a first conductivity type is n-type, and a second conductivity type is p-type.

First Embodiment

FIG. 1 is a schematic perspective view illustrating a configuration of a semiconductor light emitting device according to a first embodiment.

A semiconductor light emitting device 110 according to the first embodiment includes a structure 100, a first electrode layer 30, and a second electrode layer 20.

The structure 100 includes a first semiconductor layer of a first conductivity type 51, a second semiconductor layer of a second conductivity type 52, and a light emitting layer 53. The light emitting layer 53 is provided between the first semiconductor layer 51 and the second semiconductor layer 52.

The first semiconductor layer 51 includes a cladding layer 512 made from, for example, n-type InAlP. The cladding layer 512 is formed on a substrate 511 of, for example, n-type GaAs. In this embodiment, for convenience the substrate 511 is included in the first semiconductor layer 51.

The second semiconductor layer 52 is provided between the first semiconductor layer 51 and the second electrode layer 20. The second semiconductor layer 52 includes a cladding layer 521 made from, for example, p-type InAlP. The light emitting layer 53 is provided between the first semiconductor layer 51 and the second electrode layer 20. Specifically, the light emitting layer 53 is provided between the first semiconductor layer 51 and the second semiconductor layer 52. In the semiconductor light emitting device 110, a heterostructure is constituted by, for example, the cladding layer 512 of the first semiconductor layer 51, the light emitting layer 53, and the cladding layer 521 of the second semiconductor layer 52.

The second electrode layer 20 is provided on the side of the second semiconductor layer 52 that is opposite the first semiconductor layer 51. The second electrode layer 20 uses, for example Au and Ag, or Au and Ag to which impurities have been added, as described later. The second electrode layer 20 has electrical continuity with the second semiconductor layer 52.

In this embodiment, for convenience of explanation, the second semiconductor layer 52 side of the structure 100 is defined as the front side or top side, and the first semiconductor layer 51 side of the structure 100 is defined as the reverse side or bottom side. Also, a direction from the first semiconductor layer 51 toward the second semiconductor layer 52 (the stacking direction) is defined as the "Z-axis direction".

The second electrode layer 20 includes a metal portion 23 and a plurality of apertures 21.

A thickness of the metal portion 23 along the Z-axis direction is, for example, not less than 10 nm and not more than 100 nm. Compared with the case where the thickness of the metal portion 23 exceeds 100 nm, sufficient light transmittance can be obtained by making the thickness not more than 100 nm.

The apertures 21 penetrate the metal portion 23 in the Z-axis direction. The equivalent circles diameter of each apertures 21 is not less than 10 nm and not more than 5 μm, when viewed from the Z-axis direction.

Here, the equivalent circle diameter is defined by the following equation.

$$\text{Equivalent circle diameter} = 2 \times (\text{Area}/\pi)^{1/2}$$

"Area" is the area of the shape of an aperture 21 when viewed from the Z-axis direction.

The apertures 21 are not necessarily circular shaped. Therefore in the embodiment, the aperture 21 is specified using the definition of the equivalent circle diameter.

The first electrode layer 30 has electrical continuity with the first semiconductor layer 51. In this example, the first electrode layer 30 is provided on the reverse side of the structure 100. Au, for example, is used for the first electrode layer 30.

The second semiconductor layer 52 includes a first portion 52a and a second portion 52b. The first portion 52a is provided in the second semiconductor layer 52 on the light emitting layer 53 side. In this example, the first portion 52a is a cladding layer 521.

The second portion 52b is provided between the first portion 52a and the second electrode layer 20. The second portion 52b may be a part of the cladding layer 521.

Also, the second portion 52b may be provided using a different material from the first portion 52a.

If a natural oxide film is generated at the interface between the second portion 52b and the second electrode layer 20, the natural oxide film is assumed to be included in the second portion 52b.

In the semiconductor light emitting device 110 according to this embodiment, the second semiconductor layer 52 forms a Schottky junction with the metal portion 23 of the second electrode layer 20. More specifically, a Schottky junction is formed between the second portion 52b of the second semiconductor layer 52 and the metal portion 23 of the second electrode layer 20. A Schottky junction means a junction at which a Schottky barrier is formed at an interface.

Here, a Schottky junction between a metal and an n-type semiconductor satisfies $\phi m > \phi s$. Also, a Schottky junction between a metal and a p-type semiconductor satisfies $\phi m < \phi s$. In the above, $\phi m$ is the metal work function, $\phi s$ is the semiconductor work function, in other words the difference between the vacuum level and the Fermi level. Here, in an n-type semiconductor $\phi s \sim Xs$, and in a p-type semiconductor $\phi s \sim Xs + Eg$. Here $Xs$ is the semiconductor electron affinity, and $Eg$ is the band gap energy.

Also, the height of the Schottky barrier $\phi B$ at the Schottky junction between a metal and an n-type semiconductor is represented by $\phi B = \phi m - Xs$. Also, the height of the Schottky barrier $\phi B$ at the Schottky junction between a metal and a p-type semiconductor is represented by $\phi B = Xs + Eg - \phi m$.

In this embodiment, besides the Schottky junction due to the contact between the metal portion 23 and the second portion 52b, there is also a Schottky junction in the state where there is a natural oxide film interposed between the metal portion 23 and the second portion 52b.

In this type of semiconductor light emitting device 110, the face on which the second electrode layer 20 is formed is mainly used as the light emitting face. In other words, by applying a predetermined voltage between the second electrode layer 20 and the first electrode layer 30, light having a predetermined central wavelength is emitted from the light emitting layer 53. This light is mainly extracted to the outside from a major surface 20a of the second electrode layer 20. In this embodiment, the face from which the light is extracted is referred to as the light extraction face. Also, a direction along the light extraction face is referred to as the in-plane direction (or simply in-plane).

In the semiconductor light emitting device 110 according to this embodiment, there is a Schottky junction between the second semiconductor layer 52 and the second electrode layer 20. Comparing with the case where there is an ohmic contact, it is possible to equalize the current in the light extraction face, which flows in the Z-axis direction, while maintaining the spread of current in the second electrode layer 20 which includes the micro apertures 21.

According to the semiconductor light emitting device 110 according to this embodiment, it is possible to improve a luminous efficiency of the light emitting layer 53 and equalize the brightness in the light extraction face, where the light is extracted via the second electrode layer 20.

Next, an example of the semiconductor light emitting device 110 is explained.

The semiconductor light emitting device 110 includes, for example, an n-type GaAs substrate 511, and a heterostructure that includes for example an n-type InAlP cladding layer 512, an InGaAlP light emitting layer 53, and a p-type InAlP cladding layer 521 (first portion 52a) is formed on the substrate 511. However the substrate 511 may be of the same material as the cladding layer 521. Also, the substrate 511 need not be provided.

The light emitting layer 53 may have, for example, a Multiple Quantum Well (MQW) construction wherein alternating barrier layers and well layers are provided repeatedly. Also, a Single Quantum Well (SQW) may be provided, where the single well layer is sandwiched by a pair of the barrier layers.

The second portion 52b made from, for example, p-type GaP is formed on the cladding layer 521 (first portion 52a). The second portion 52b, for example, adjusts the current injected from the second electrode layer 20 in the Z-axis direction.

The second electrode layer 20 is provided on the second portion 52b, i.e. the second electrode layer 20 is in contact with the second portion 52b. The second electrode layer 20 is provided with a laminated metal film (the metal portion 23) of, for example, Au and Au—Zn alloy, as a p-side electrode. A Schottky junction is formed between the second portion 52b and the metal portion 23. The plurality of apertures 21 is provided in the second electrode layer 20 penetrating the metal portion 23 along the Z-axis direction. The size and arrangement of the apertures 21 may be regular or may be irregular.

An n-side electrode of the first electrode layer 30 that includes, for example, Au—Ge alloy is formed on a reverse face of the substrate that is included in the first semiconductor layer 51. The first electrode layer 30 forms ohmic contact and has electrical continuity with the first semiconductor layer 51.

In the semiconductor light emitting device 110 according to this embodiment, light emitted from the light emitting layer 53 is extracted to the outside from the light extraction face, where the second electrode layer 20 is provided on the current diffusion layer of the second semiconductor layer 52.

The second portion 52b is provided with the impurity concentration to form a Schottky junction with the metal portion 23. The impurity concentration of the second portion 52b may be uniform, or it may vary gradually in the Z-axis direction.

For example, the impurity concentration of the first portion 52a is not less than $1 \times 10^{16}$ cm$^{-3}$ and not more than $3 \times 10^{18}$ cm$^{-3}$. Also, the impurity concentration of the second portion 52b is not less than $1 \times 10^{12}$ cm$^{-3}$ and not more than $1 \times 10^{18}$ cm$^{-3}$, for example.

Also, in an embodiment, the Schottky barrier φB in the Schottky junction between the second portion 52b and the second electrode layer 20 is greater than 0.3 electron volts (eV) and less than 2.0 eV.

Here, if the Schottky barrier φB is not more than 0.3 eV, it is not possible to obtain a sufficient Schottky junction. Also, in selecting the materials for the second electrode layer 20 and the second semiconductor layer 52, the Schottky barrier φB does not exceed 2.0 eV.

In the semiconductor light emitting device 110 according to this embodiment a thickness of the second portion 52b along the Z-axis direction is, for example, not less than 5 nm and not more than 5 μm. A width of a depletion layer formed at the interface of the Schottky barrier is from about 5 nm to 300 nm. Therefore, the thickness of the second portion 52b along the Z-axis direction is more preferably not less than 5 nm and not more than 300 nm. If the thickness of the second portion 52b is smaller than 5 nm, then leakage current may increase due to tunneling. On the other hand, if the thickness of the second portion 52b is larger than 300 nm, a voltage drop may occur due to the resistance in the second portion 52b, when the current flows in the Z-axis direction.

The inventors of this patent application discovered that in the above semiconductor light emitting device 110, it is possible to obtain a more uniform spread of current when there is a Schottky junction between the second semiconductor layer 52 and the metal portion 23, compared with the case where there is an ohmic contact.

The inventors of this patent application carried out experiments (simulations) for the current flow in the semiconductor light emitting device 110 according to this embodiment and a semiconductor light emitting device 190 according to a reference example.

Figure 2A:
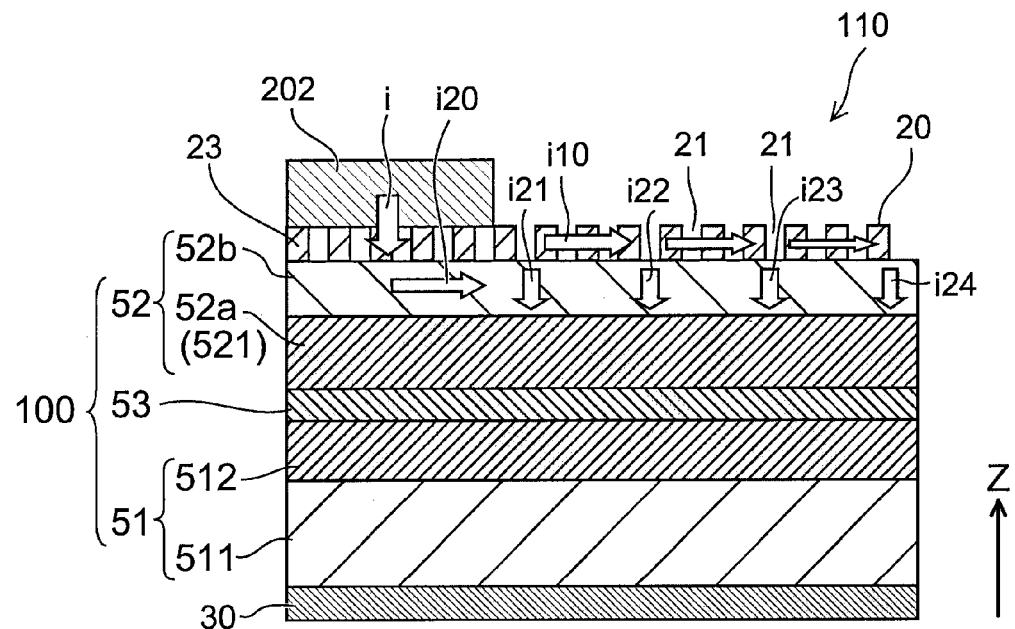
FIGS. 2A and 2B are schematic cross-sectional views illustrating examples of the semiconductor light emitting devices used in the experiments (simulations)
Figure 2B:
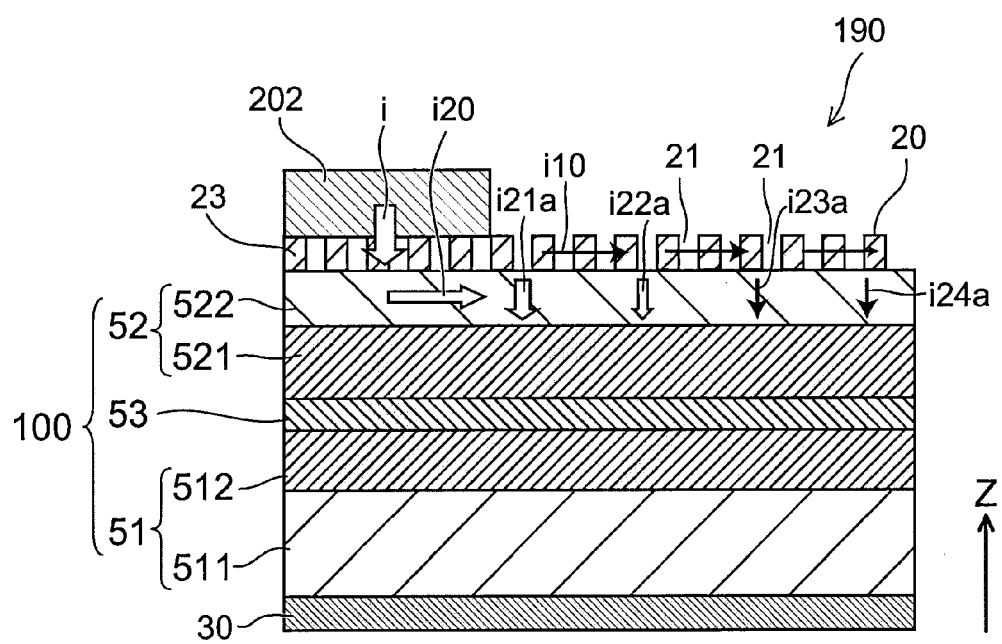

FIGS. 2A and 2B are schematic cross-sectional views illustrating examples of the semiconductor light emitting devices used in the experiments (simulation).

FIG. 2A is a schematic cross-sectional view illustrating the semiconductor light emitting device 110.

In the semiconductor light emitting device 110, the second portion 52b of the second semiconductor layer 52 and the metal portion 23 of the second electrode layer 20 form a Schottky junction.

FIG. 2B is a schematic cross-sectional view illustrating the semiconductor light emitting device 190.

In the semiconductor light emitting device 190, a current diffusion layer 522 of a second semiconductor layer 52 and a metal portion 23 of a second electrode layer 20 form an ohmic contact.

Both of these drawings illustrate a part of the cross-section where a pad electrode 202 is provided at the center.

Figure 3A:
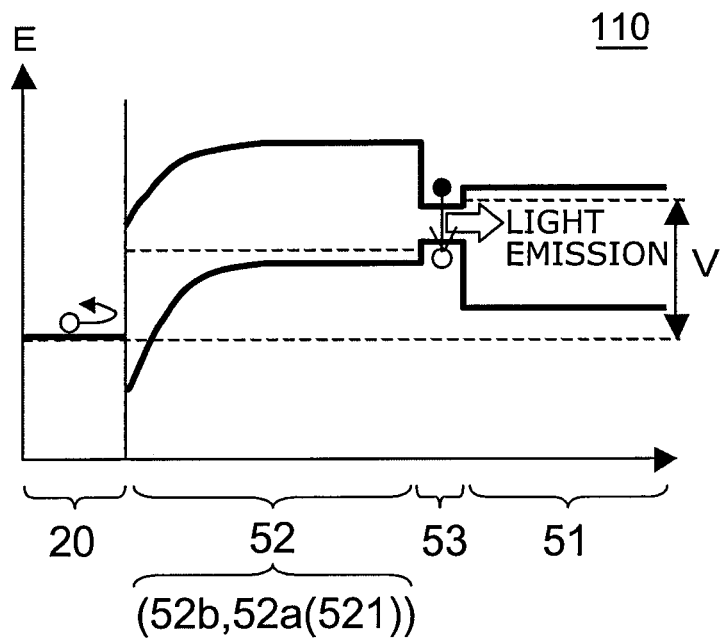
FIGS. 3A and 3B are graphs schematically showing band structures of the semiconductor light emitting devices.
Figure 3B:
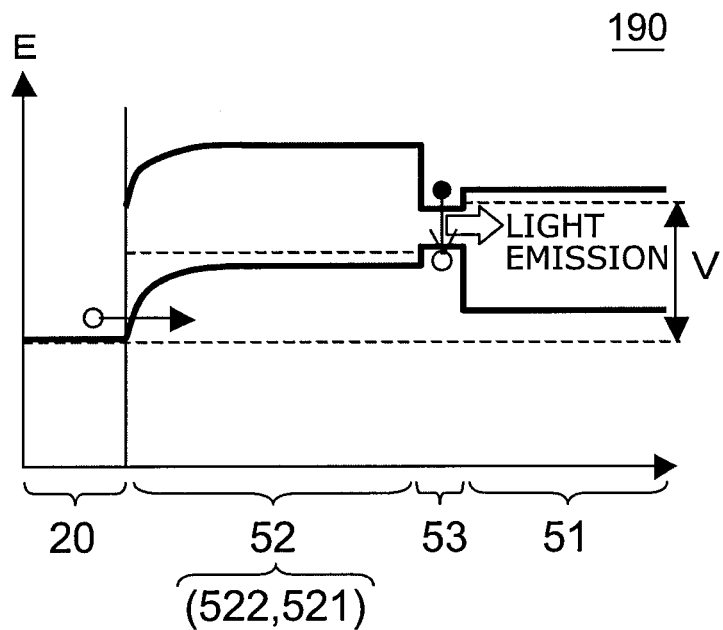

FIGS. 3A and 3B are graphs showing band structures of the semiconductor light emitting devices.

FIG. 3A shows the band structure of the semiconductor light emitting device 110.

FIG. 3B shows the band structure of the semiconductor light emitting device 190.

The inventors of this patent application investigated (carried out simulation for) the variation in lighting and brightness within the light extraction face of the semiconductor light emitting devices 110 and 190. From the results it was found that the variation in lighting within the light extraction face of the semiconductor light emitting device 190 was larger than that of the semiconductor light emitting device 110. The brightness of the semiconductor light emitting device 110 was also higher than that of the semiconductor light emitting device 190.

When there is an ohmic contact between the metal portion 23 and the current diffusion layer 522 as in the semiconductor light emitting device 190, current can easily flow from the second electrode layer 20 to the second semiconductor layer 52. In other words, as shown in FIG. 3B, there is no energy barrier between the second electrode layer 20 and the second semiconductor layer 52. Therefore, in the semiconductor light emitting device 190, it was considered that the variation in lighting in-plane in the light extraction face is reduced due to the spread of current towards the second semiconductor layer 52.

However, according to the results of the experiments (simulation) carried out by the inventors of this patent application, the opposite result was obtained. In other words, the better result was obtained in the case where the Schottky junction is formed between the metal portion 23 and the second portion 52b.

The inventors of this patent application inferred that the mechanism that produced these results was as follows.

As illustrated in FIGS. 2A and 2B, in the semiconductor light emitting devices 110 and 190, a current i injected from the pad electrode 202 flows through the second electrode layer 20 and the second semiconductor layer 52.

Here, in the semiconductor light emitting device 190, there is an ohmic contact between the second electrode layer 20 and the current diffusion layer 522, so the current flowing through the second electrode layer 20 can easily flow into the current diffusion layer 522 (i20a). In particular, the current below the pad electrode 202 easily flows from the second electrode layer 20 to the current diffusion layer 522. Therefore, the greater a separation from the pad electrode 202, the smaller the current (i21a through i24a) flowing through the current diffusion layer 522 along the Z-axis direction.

On the other hand, in the semiconductor light emitting device 110, there is a Schottky junction between the second electrode layer 20 and the second portion 52b of the second semiconductor layer 52, so the current flowing through the second electrode layer 20 does not easily flow to the second portion 52b (i20). In other words, as illustrated in FIG. 3A, there is a Schottky barrier provided between the second electrode layer 20 and the second semiconductor layer 52. Therefore the quantity of current (i21 through i24) flowing from the second electrode layer 20 to the second portion 52b becomes less dependent on the distance from the pad electrode 202. In other words, the quantity of the current (i21 through i24) flowing through the second portion 52b in the Z-axis direction is more uniform compared with the quantity of the current (i21a through i24a) flowing through the current diffusion layer 522 along the Z-axis direction.

From this, it is considered that by providing a Schottky junction between the second electrode layer 20 and the metal portion 23, it is possible to reduce the variation in lighting within the light extraction face. Also, it is considered that by being able to make the quantity of current flowing through the second portion 52b along the Z-axis direction more uniform, it is possible to improve the overall brightness of the semiconductor light emitting device 110.

Also, in the semiconductor light emitting device 110, high heat dissipation is obtained by providing the comparatively large second electrode layer 20, so the temperature rise of the semiconductor light emitting device 110 is reduced. Also, the temperature rise of the semiconductor light emitting device 110 is reduced by adjusting the size (for example the equivalent circle diameter) of the apertures 21 provided in the second electrode layer 20. In other words, a series resistance is reduced by lowering a forward direction voltage of the semiconductor light emitting device 110, so that heat generation itself can be reduced.

In order to realize this effect, the current should flow uniformly over the whole face of the second semiconductor layer 52 from the second electrode layer 20 having the apertures 21. In order that the current can flow uniformly to the second semiconductor layer 52, sizes and distances between the centers of the plurality of apertures 21 are limited to a certain extent.

The extent over which the current flows, as obtained from investigations such as simulation or the like, is up to about 5 μm from the edge of the metal portion 23 of the second electrode layer 20, although this depends on the doping concentration and the like of the semiconductor layer through which the current flows. In other words, if the diameter of the apertures 21 is larger than this, an area over which the current does not flow is produced, and uniform light emission is not obtained. Therefore, the upper bound of the equivalent circle diameter of the apertures 21 is not more than 5 μm, and preferably not more than 1 μm.

Here, by providing in the second electrode layer 20 the apertures 21 whose width along the major surface of the metal portion 23 is sufficiently smaller than the wavelength of the light emitted from the light emitting layer 53, the second electrode layer 20 functions as a light transmitting electrode, even though it is metal. This is because the straight line distance of the continuous metal portions that are not obstructed by apertures 21 is sufficiently shorter than the wavelength of the light, so when the light illuminates the second electrode layer 20, the movement of free electrons induced by the electric field of the light is obstructed, so the metal becomes transparent.

In Drude's theory, which describes reflections in metals, a material under consideration is assumed to be a uniform structure that is sufficiently large relative to the wavelength of the light that is irradiating it. When a substance is irradiated with light having a frequency that is lower than a plasma frequency, what happens to the motion of the free electrons within the substance is that electrons within the substance are polarized by the electric field of the light. This polarization is induced in a direction to cancel out the electric field of the light. By shielding the electric field of the light by the induced polarization of the electrons, the light cannot pass through the substance, or a so-called plasma reflection occurs. Here, if the substance in which polarization of the electrons is induced is sufficiently smaller than the wavelength of light, a motion of the electrons is restricted by a geometric structure, so it is considered that shielding of the electric field of the light is not possible. This can be realized by making the width of the metal portion formed by two structurally adjacent apertures sufficiently smaller than the wavelength of the light.

Also, a distance P between adjacent apertures 21 should preferably be, for example, not less than 20 nm, and not more than 400 nm from the point of view of light transmittance.

Also, it is particularly preferable that the upper bound of the equivalent circle diameter of the apertures 21 from the viewpoint of electrical conductivity is not more than 0.9 P, where P is the distance between adjacent apertures 21. Specifically, not more than 360 nm is preferable. On the other hand, although there is no limitation on the lower bound of the equivalent circle diameter of the apertures 21 from the viewpoint of electrical conductivity, the lower bound should be not less than 10 nm, and preferably not less than 30 nm from the viewpoint of easiness in the manufacturing process.

Preferably the metal portion 23 of the second electrode layer 20 contains, for example, at least one of Ag and Au as the base material. Thereby, absorption loss of light emitted from the light emitting layer 53 is suppressed. In addition, the metal portion 23 preferably contains any material selected from the group of Al, Zn, Zr, Si, Ge, Pt, Rh, Ni, Pd, Cu, Sn, C, Mg, Cr, Te, Se, and Ti, or an alloy that includes two or more selected from this group. In this way ohmicity, adhesiveness and heat resistance properties are improved. Preferably the metal used as the material of the metal portion 23 has higher electrical conductivity and thermal conductivity. This embodiment is not limited to the materials described herein, and other metal may be used.

For example, arbitrary two points in the second electrode layer 20 are connected to each other via the metal portion 23 (the portion where the apertures 21 are not provided) without discontinuity, and the point is also connected via the metal portion 23 to the current supply sources such as the pad electrode and so on. This is to maintain a low resistance value to ensure electrical continuity.

Also, if a plurality of current supply sources is provided, each current supply source may be connected to its corresponding metal portion 23 of the second electrode layer 20.

Also, a sheet resistance of the second electrode layer 20 is preferably not more than 10 Ω/square or less, and more preferably not more than 5 Ω/square. The smaller the sheet resistance, the smaller the heat generated in the semiconductor light emitting device 110, and uniform light generation can be obtained, and the increase in brightness is more distinct.

In the semiconductor light emitting device 110, the metal layer is formed in a similar way, and the second electrode layer 20 is formed by forming the apertures 21 by a method that is described later.

As a result of the investigation, it was found that if the thickness of the second electrode layer 20 is not less than 10 nm, a sufficient resistance value can be realized. On the other hand, the greater the thickness of the second electrode layer 20 the lower the resistance value. In accordance with the perspective of ensuring the transmittance of the light emitted from the light emitting layer 53, the thickness of the second electrode layer 20 is preferably not more than 1 μm, and more preferably not more than 50 nm.

Here, the reflectance (bulk reflectance) of the second electrode layer 20 with respect to the light emitted from the light emitting layer 53 may be not less than 70%. This is because high absorptance corresponding to low reflection of metal causes loss of the light due to the conversion into heat. The light reflected in the second electrode layer 20 can be reused by providing a reflection layer (not shown in the drawings) or the like below the light emitting layer 52 and can be extracted via the second electrode layer. Thereby, the light emitted from the light emitting layer 53 passes through the second electrode layer 20.

By providing the second semiconductor layer 52 in the semiconductor light emitting device 110 as described above, it is possible to inject sufficient current along the Z-axis direction to the light emitting layer 53 via the second electrode layer 20 which includes the plurality of apertures 21, while maintaining the spread of current toward the light emitting layer 53. Therefore, it is possible to improve the luminous efficiency of the light emitting layer 53, increase the brightness of the light emitted from the second electrode layer 20, and improve uniformity within the light extraction face.

Second Embodiment

The following is an explanation of a second embodiment. The second embodiment is a manufacturing method of a semiconductor light emitting device.

Figure 4:
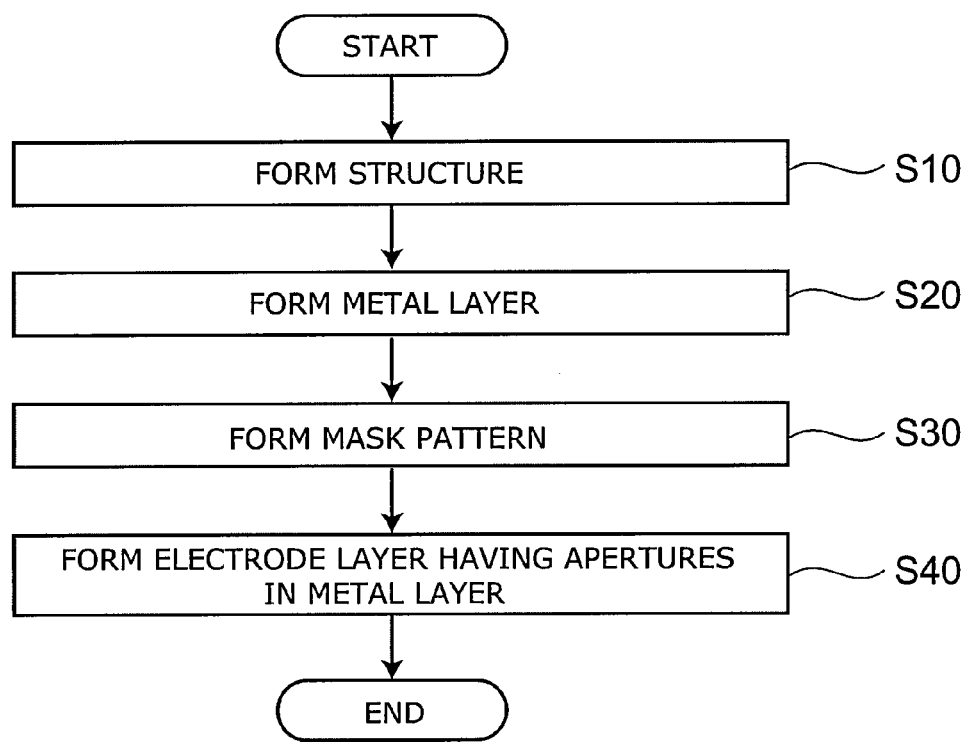
FIG. 4 is a flowchart illustrating a method of manufacturing a semiconductor light emitting device.

FIG. 4 is a flowchart illustrating the method of manufacturing a semiconductor light emitting device according to the second embodiment.

Specifically, the method for manufacturing the semiconductor light emitting device according to the second embodiment includes: forming a structure by forming a first semiconductor layer 51, forming a light emitting layer 53 on the first semiconductor layer 51, and forming a second semiconductor layer 52 on the light emitting layer 53 (Step S10); forming a metal layer on the second semiconductor layer 52 with a thickness along the Z-axis direction not less than 10 nm and not more than 300 nm, wherein Schottky junction is formed between the metal layer and the second semiconductor layer 52 (Step S20); forming a mask pattern on the metal layer (Step S30); and forming an electrode layer (second electrode layer) having a plurality of apertures 21 having an equivalent circle diameter not less than 10 nm and not more than 5 μm when viewed from the Z-axis direction by etching the metal layer using the mask pattern as a mask (Step S40).

Specifically, the manufacturing method is as follows.
(A) Method Using a Stamper One method for manufacturing a semiconductor light emitting device according to this embodiment is to use a stamper.

Specifically, the semiconductor light emitting device can be obtained as follows, for example.

FIG. 5A to 5F are schematic cross-sectional views illustrating an example of the method using a stamper.

Figure 5A:
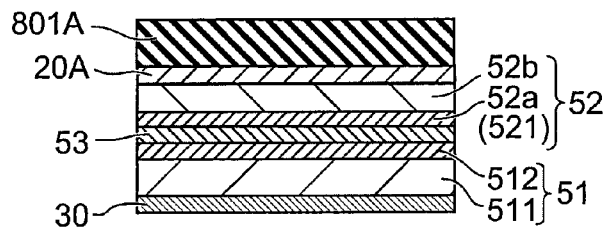
FIG. 5A to 5F are schematic cross-sectional views illustrating a method of manufacturing the semiconductor light emitting device.

As illustrated in FIG. 5A, first the light emitting layer 53 is formed on the first semiconductor layer 51, and the second semiconductor layer 52 is formed on the light emitting layer 53. In the second semiconductor layer 52, a first portion 52a and a second portion 52b are formed in that order from the light emitting layer 53. Also, a first electrode layer 30 is formed in contact with the first semiconductor layer 51.

Next, a metal layer 20A is formed on the second semiconductor layer 52. The metal layer 20A forms a Schottky junction with the second semiconductor layer 52. Then a resist film 801A is formed on the metal layer 20A.

Figure 5E:
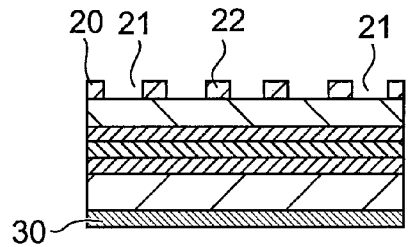
Figure 5B:
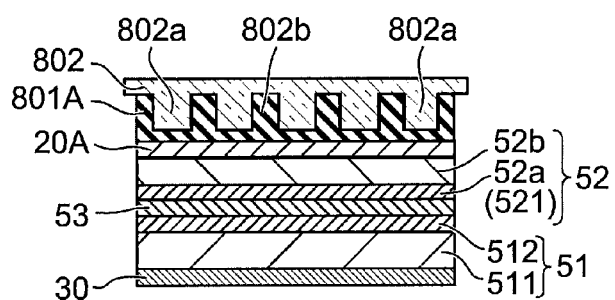

Next, as illustrated on FIG. 5B, a stamper 802 having protrusions 802a is prepared. For example, the stamper 802 is provided with a plurality of protrusions 802a on a transfer face. Recesses 802b are provided between the plurality of protrusions 802a.

The stamper 802 can be manufactured by, for example, forming the desired structure on quartz by electron beam lithography, but there is no limitation on the material of the stamper 802 or the method of forming a microstructure of recesses and protrusions in the stamper 802. For example, the stamper 802 can be formed by a method using the self-assembling of block copolymers or a mask formed of fine-particles.

Next, as illustrated in FIG. 5B, the side of the stamper 802 having the protrusions is pressed into the resist film 801A to perform imprinting. The resist film 801A may be heated to a predetermined temperature if necessary. After imprinting, the resist film 801A is cured by cooling down to room temperature, and the stamper 802 is released. In this way, a resist pattern 801B is formed having recesses corresponding to the protrusions 802a, as illustrated in FIG. 5C.

Figure 5F:
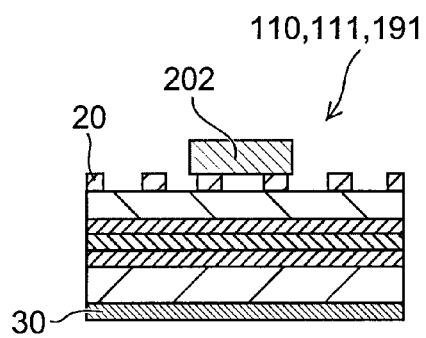
Figure 5C:
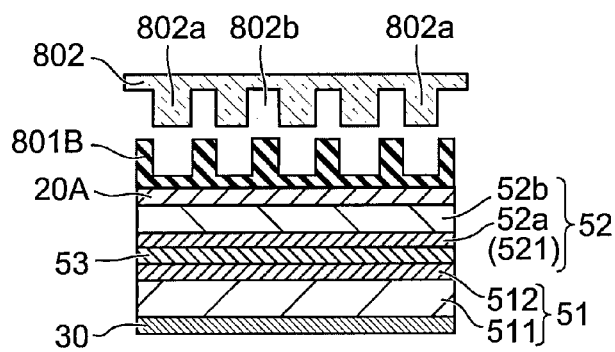
Figure 5D:
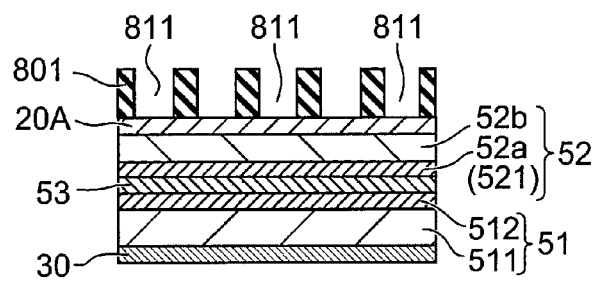

Next, as illustrated in FIG. 5D, the resist pattern 801B is partially removed by etching. That is the bottoms of the recesses in the resist pattern 801B are removed, and the metal layer 20A is exposed. Thereby, the resist pattern 801 having apertures 811 are formed, where the metal layer 20A is exposed in the bottom.

Next, the metal layer 20A is etched by ion milling using the resist pattern 801 as a mask in which the resist apertures 811 have been formed. Thereby, as illustrated in FIG. 5E, the apertures 21 are formed in the metal layer 20A corresponding to the apertures 811. The metal layer 20A becomes the second electrode layer 20 when the apertures 21 are formed. After etching the metal layer 20A, the resist pattern 801 is removed.

Finally, as illustrated in FIG. 5F, a pad electrode 202 is formed to complete the semiconductor light emitting device 110.

The method of using the stamper is not limited to heat forming as described above. Various technologies can be used, such as forming by hardening the resist with light. Furthermore, a stamper made of flexible material, such as PDMA (poly dimethylacrylamide) or the like, may be used.
(B) Method Using the Self-Assembling of Block Copolymers One method for manufacturing a semiconductor light emitting device according to this embodiment is to use phase separation by the self-assembling of block copolymers.

Specifically, the semiconductor light emitting device can be obtained as follows, for example.

FIG. 6A to 6F are schematic cross-sectional views illustrating an example of the method using the self-assembling of block copolymers.

Figure 6A:
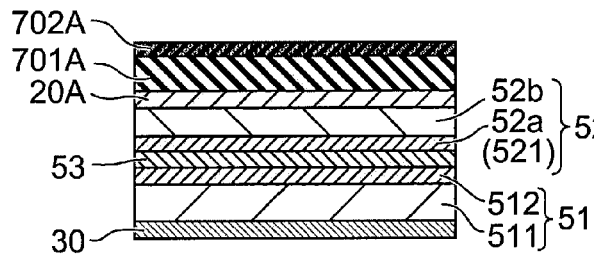
FIG. 6A to 6F are schematic cross-sectional views illustrating another method of manufacturing the semiconductor light emitting device.

As illustrated in FIG. 6A, first the light emitting layer 53 is formed on the first semiconductor layer 51, and the second semiconductor layer 52 is formed on the light emitting layer 53. In the second semiconductor layer 52, the first portion 52a and the second portion 52b are formed in that order from the light emitting layer 53. Also, the first electrode layer 30 is formed in contact with the first semiconductor layer 51.

Next, a metal layer 20A is formed on the second semiconductor layer 52.

Next, a resist film 701A is formed on the metal layer 20A. Then a Spin on Glass (SOG) layer 702A is formed on the resist film 701A.

Figure 6E:
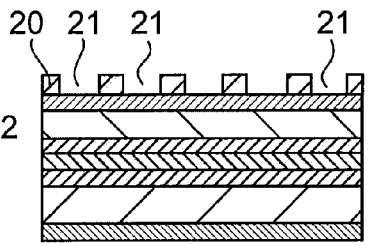
Figure 6B:
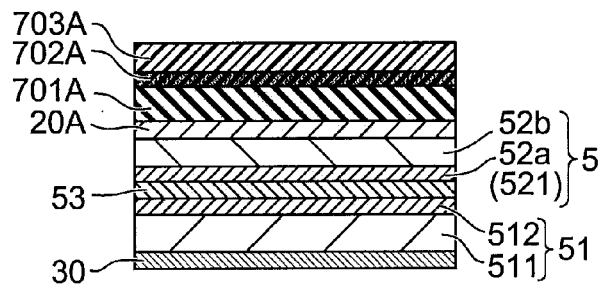

Next, as illustrated in FIG. 6B, a solvent in which block copolymers having two types of polymer block are dissolved is applied on the SOG layer 702A by the spin coating method. Then, pre-baking is carried out to remove the solvent and to form a block copolymer layer 703A. Then the block copolymer layer 703A is annealed. Thereby, phase separation of the two types of polymer is induced, as illustrated in FIG. 6C, and a dot pattern 703 is formed by one type of polymer.

Next, the dot pattern 703 is etched using a Reactive Ion Etching (RIE) apparatus. Here, due to the difference in the etching speeds of the two types of polymer, a hole pattern is formed by a polymer with the faster etching speed.

Figure 6F:
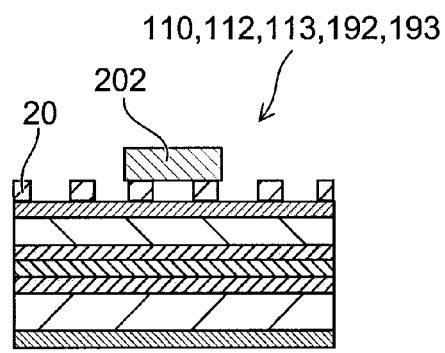
Figure 6C:
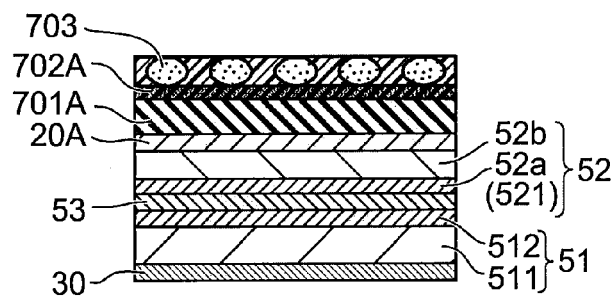
Figure 6D:
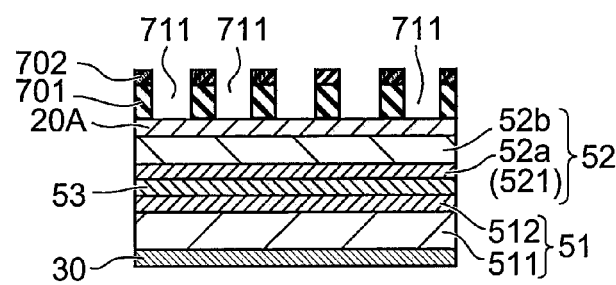

Next, the SOG layer 702A is etched using, for example, an RIE apparatus using the polymer having the hole pattern as a mask, and a SOG hole pattern 702 is formed as illustrated in FIG. 6D. Next, a resist hole mask 701 is formed using an RIE apparatus and the SOG hole pattern 702 as a mask. Resist apertures 711 are provided in the resist hole mask 701.

Next, ion milling is carried out and the metal layer 20A is etched using the SOG hole pattern 702 and the resist hole mask 701 as masks. Thereby, as illustrated in FIG. 6E, the metal layer 20A corresponding to the resist apertures 711 is etched, and the apertures 21 are formed in the metal layer 20A. The metal layer 20A becomes the second electrode layer 20 when the apertures 21 are formed. After etching the metal layer 20A, the SOG hole pattern 702 and the resist hole mask 701 are removed.

Finally, as illustrated in FIG. 6F, the pad electrode 202 is formed, to complete the semiconductor light emitting device 110.

In this embodiment, the method for manufacturing a semiconductor light emitting device is not limited to the method as described above. For example, a method wherein the mask pattern is manufactured by electron beam lithography and the metal layer 20A is etched using this mask pattern, or a method wherein the metal layer 20A is etched using a single molecule layer of fine particles such as silica or the like as the mask, may be used.

Next, examples are explained. The materials, values, manufacturing conditions, and so on indicated in the following example are examples, and the invention is not limited to these examples.

First Example

In a first example, a semiconductor light emitting device 111 according to the processes illustrated in FIG. 5A to 5F is manufactured in accordance with the method using a stamper as described in (A) above.

First, as illustrated in FIG. 5A, a heterostructure that includes the n-type InAlP cladding layer 512, the AlInGaP light emitting layer 53, the p-type InAlP cladding layer 52a (the first portion 52a) or the like is formed on the n-type GaAs substrate 511. Then, the p-type GaP second portion 52b is epitaxially grown on the p-type InAlP cladding layer 52a, for example. At this time, the concentration of impurities in the second portion 52b is $1\times10^{17}$ cm$^{-3}$.

Next, an n-side electrode, for example, is formed as the first electrode layer 30 on the reverse face of the substrate 511. For example, an Au—Ge alloy film is formed with a thickness of 150 nm. The Au—Ge alloy film is formed by a vacuum deposition, for example. Then, annealing is carried out in a nitrogen atmosphere for 30 minutes at 450° C., to obtain ohmic contact between the first electrode layer 30 and the substrate 511. Next, the metal layer 20A containing, for example, AgCu (Cu content 1%, thickness 30 nm) is formed on the second semiconductor layer 52 by the vacuum deposition.

Next, resist solution is applied on the metal layer 20A. The resist solution of THMR-iP3250 (Tokyo Ohka Kogyo Co., Ltd.) diluted 1:2 in ethyl lactate (EL) can be used. The resist solution is spin coated for 30 seconds at 2000 rpm. Then the solvent of the resist solution is evaporated by heating for 90 seconds at 110° C. on a hot plate. The resist film 801A is formed on the metal layer 20A with the thickness of 150 nm, for example.

Next, as illustrated in FIG. 5B, a quartz stamper 802 is prepared having protrusions 802a with, for example, 200 nm equivalent circle diameter, 300 nm distance, and 150 nm height. Then, the resist film is heated up to 120° C., and the side of the stamper 802 with the protrusions 802a is pressed into the resist film 801A with 10 MPa pressure, for example.

Then, as illustrated in FIG. 5C, the substrate is cooled down to room temperature and the stamper 802 is released. Thereby, the recesses with 200 nm equivalent circle diameter, 300 nm distance, and 100 nm depth are formed on the resist film 801A.

Next, using an RIE apparatus, the resist pattern 801B on which the recess pattern is formed is etched for 30 seconds under conditions of $O_2$ flow rate 30 sccm, pressure 1.33 Pa (10 mTorr), and RF power 100 W (Watts). As a result of this etching, the resist at the bottoms of the recesses are removed, as illustrated in FIG. 5D, and the resist pattern 801 having resist apertures 811 is formed.

Next, etching on the metal layer 20A is carried out using this resist pattern 801 as the mask. The etching is carried out using, for example, an ion milling apparatus. Etching is carried out for 90 seconds under the conditions of acceleration voltage 500V, and ion current 40 mA. Thereby, the second electrode layer 20 with the apertures 21 is formed, as illustrated in FIG. 5E.

After etching the metal layer 20A, oxygen ashing is carried out to remove the resist pattern 801. Finally, as illustrated in FIG. 5F, the pad electrode 202 is formed. Thereby, the semiconductor light emitting device 111 according to the first example is completed.

In the semiconductor light emitting device 111 according to the first example, the thickness of the metal portion 23 of the second electrode layer 20 along the Z-axis direction is 30 nm, the equivalent circle diameter of the apertures 21 is 220 nm, the distance (interval) between adjacent apertures 21 is 300 nm, the thickness of the second portion 52b along the Z-axis direction is 18 nm, and the height of the Schottky barrier estimated from the voltage-current characteristic is 0.68 eV.

Also, a semiconductor light emitting device 191 according to a first comparative example is manufactured in accordance with a manufacturing process that is the same as that of the semiconductor light emitting device 111 according to the first example. In the semiconductor light emitting device 191 according to the first comparative example, the current diffusion layer 522 is provided instead of the second portion 52b. The concentration of impurities in the current diffusion layer 522 is $2\times10^{20}$ cm$^{-3}$. Also, in the semiconductor light emitting device 191, there is ohmic contact between the second electrode layer 20 and the current diffusion layer 522, with a contact resistance of $1.2 \times 10^{-6}$ $\Omega cm^2$, and the rest is the same as the semiconductor light emitting device 111 according to the first example.

For the semiconductor light emitting devices 111 and 191, the variation in the lighting within the light extraction face and the brightness are measured. Here, the variation in the lighting within the light extraction face is a difference between the brightness of a brightest part and the brightness of a darkest part within the light extraction face.

The measurements are carried out on chips having areas of external shape viewed from the Z-axis direction of $9.0 \times 10^{-2}$ mm$^2$ (length of one side=300 μm) and $8.1 \times 10^{-1}$ mm$^2$ (length of one side=900 μm). The current is 350 milliamperes (mA).

In the semiconductor light emitting device 111 according to the first example, in the chip with 300 μm side, the variation in lighting within the light extraction face is 0.1%, and in the chip with 900 μm side, the variation is 3.7%.

In the semiconductor light emitting device 191 according to the first comparative example, in the chip with 300 μm side, the variation in lighting within the light extraction face is 5.2%, and in the chip with 900 μm side, the variation is 10.3%.

Also, in the case of the chip with 300 μm side, the overall brightness of the semiconductor light emitting device 111 according to the first example is 1.2 times the overall brightness of the semiconductor light emitting device 191 according to the first comparative example, and is 1.3 times in the case of the chip with 900 μm side.

For both the semiconductor light emitting devices 111 and 191, the same tests are carried out on chips with 10 nm equivalent circle diameter of the apertures 21 and 16 nm distance to adjacent apertures 21, and chips with 5 μm equivalent circle diameter of the apertures 21 and 8 μm distance to adjacent apertures 21. In all cases, the results are the same as the above.

Also, when 500 mA current was supplied to the chips with 300 μm side, the variation in lighting within the light extraction face of the semiconductor light emitting device 111 was 0.2%, but in contrast for the semiconductor light emitting device 191, it was 27.1%. At this time, the overall brightness of the chip of the semiconductor light emitting device 111 according to the first example was 1.5 times the overall brightness of the chip of the semiconductor light emitting device 191 according to the first comparative example.

Also, when 4 Amperes (A) current was supplied to the chips with 900 μm side, the variation in lighting within the light extraction face of the semiconductor light emitting device 111 was 4.2%, but for the semiconductor light emitting device 191, it was 57.2%. At this time, the overall brightness of the chip of the semiconductor light emitting device 111 according to the first example was 2.1 times the overall brightness of the chip of the semiconductor light emitting device 191 according to the first comparative example.

In this way, by making the light emission uniform in the light extraction face, the brightness is greatly improved.

Second Example

In a second example, the semiconductor light emitting device 112 is manufactured according to the processes illustrated in FIG. 6A to 6F in accordance with the method of using the self-assembling of block copolymers as described in (B) above.

First, as illustrated in FIG. 6A, the heterostructure is formed that includes the n-type InAlGaP cladding layer 512, the AlInGaP light emitting layer 53, the p-type InAlGaP cladding layer 521, and so on, formed on the n-type GaAs substrate 511. Then, the p-type AlGaAs second portion 52b is epitaxially grown on the p-type InAlGaP cladding layer 521, for example. At this time, the concentration of impurities in the second portion 52b is $1 \times 10^{18}$ cm$^{-3}$.

Next, the metal layer 20A containing, for example, Au (thickness 10 nm) and Au—Zn alloy (Zn content 3%, thickness 30 nm) is formed on the p-type AlGaAs second portion 52b by the vacuum deposition. Next, an n-side opposing electrode is formed as the first electrode layer 30 on the reverse face of the substrate 511. For example, an Au—Ge alloy film is formed with a film thickness of 150 nm. The Au—Ge alloy film is formed by the vacuum deposition, for example. The wavelength of the light emitted from this semiconductor light emitting device is 571 nm, for example.

Next, resist solution is applied on the metal layer 20A. The resist solution of THMR-iP3250 (Tokyo Ohka Kogyo Co., Ltd.) diluted 1:3 in ethyl lactate (EL) can be used, for example. After spin coating this resist solution for 30 seconds at 2000 rpm, it is heated for 90 seconds at 110° C. on a hot plate to evaporate the solvent. Next, annealing is carried out on the resist for one hour at 250° C. in a nitrogen atmosphere, and the resist is thermally cured. The thickness of the resist film 701A formed on the metal layer 20A is 100 nm, for example.

Next, a solution of organic SOG compound (OCD-T7 T-5500 (product name), Tokyo Ohka Kogyo Co., Ltd.) diluted 1:5 in ethyl lactate (EL) is spin coated for 60 seconds at 2000 rpm on the resist film 701A. After spin coating, baking is carried out for 60 seconds at 110° C. to completely remove the solvent. Then, annealing is carried out for one hour at 250° C. in a nitrogen atmosphere. The thickness of the SOG layer 702A formed on the resist film 701A is 30 nm.

Next, as illustrated in FIG. 6B, a block copolymer having a block of polystyrene (hereafter referred to as PS) with a molecular weight of 160,000 and a block of polymethylmethacrylate (hereafter referred to as PMMA) with a molecular weight of 45,000 is dissolved in solvent and applied on the SOG layer 702A by the spin coating method for 30 seconds at 3000 rpm. The block copolymer is then pre-baked for 90 seconds at 110° C. to remove the solvent and the block copolymer layer 703A with a 70 nm thickness is obtained on the SOG layer 702A.

Then, as illustrated in FIG. 6C, the block copolymer layer 703A is annealed for 4 hours at 210° C. in a nitrogen atmosphere, phase separation of the PS and PMMA is induced, and a PMMA dot pattern 703 with 40 nm equivalent circle diameter and 60 nm pitch is formed.

Next, the phase separated block copolymer film is etched by reactive ion etching for 10 seconds under the conditions of $O_2$ flow rate 30 sccm, pressure 13.3 Pa (100 mTorr), and power 100 W. Here, the PMMA is selectively etched due to the difference in etching speed of the PS and PMMA, so a PS hole pattern is formed.

Next, the SOG is etched for one minute using an RIE apparatus with the PS hole pattern as the mask, under the conditions of $CF_4$ flow rate 30 sccm, pressure 1.33 Pa (10 mTorr), and power 100 W. Thereby, the SOG hole pattern 702 is formed as illustrated in FIG. 6D.

Next, the resist hole mask 701 is formed by etching for 60 seconds with an RIE apparatus using the SOG hole pattern 702 as the mask, under conditions of $O_2$ flow rate 30 sccm, pressure 1.33 Pa (10 mTorr), and power 100 W.

Next, etching of the metal layer 20A is carried out for 100 seconds using an ion milling apparatus, under the conditions of acceleration voltage 500 V and ion current 40 mA. After etching the metal layer 20A, the remaining SOG hole pattern 702 and resist hole mask 701 are removed by oxygen ashing. Thereby, the second electrode layer 20 with the apertures 21 is formed, as illustrated in FIG. 6E. Finally, as illustrated in FIG. 6F, the pad electrode 202 is formed. In this way, the semiconductor light emitting device 112 according to the second example is completed.

In the semiconductor light emitting device 112 according to the second example, the thickness of the metal portion 23 of the second electrode layer 20 along the Z-axis direction is 40 nm, the equivalent circle diameter of the apertures 21 is 40 nm, the distance between adjacent apertures 21 is 60 nm, the thickness of the second portion 52b along the Z-axis direction is 90 nm, and the height of the Schottky barrier estimated from the voltage-current characteristic is 0.32 eV.

Also, a semiconductor light emitting device 192 according to a second comparative example is manufactured in accordance with the manufacturing process that is the same as that of the semiconductor light emitting device 112 according to the second example. In the semiconductor light emitting device 192 according to the second comparative example, the current diffusion layer 522 is provided instead of the second portion 52b. The concentration of impurities in the current diffusion layer is $3\times10^{19}$ cm$^{-3}$. Also, in the semiconductor light emitting device 192, although a complete ohmic contact is not formed between the second electrode layer 20 and the current diffusion layer 522, the height of the Schottky barrier estimated from the voltage-current characteristic is 0.2 eV. As a result, it can be regarded as an ohmic-like contact. The contact resistance between the second electrode layer 20 and the current diffusion layer 522 is $4.0\times10^{-4}$ Ωcm$^2$, and the rest is the same as the semiconductor light emitting device 112 according to the second example.

For the semiconductor light emitting devices 112 and 192, the variation in the lighting within the light extraction face and the brightness are measured. The measurements are carried out on chips having areas of external shape viewed from the Z-axis direction of $9.0\times10^{-2}$ mm$^2$ (one side 300 μm) and $8.1\times10^{-1}$ mm$^2$ (one side 900 μm). The current is 350 mA.

In the semiconductor light emitting device 112 according to the second example, in the chip with 300 μm side, the variation in lighting within the light extraction face is 0.2%, and in the chip with 900 μm side, the variation is 5.4%.

In the semiconductor light emitting device 192 according to the second comparative example, in the chip with 300 μm side, the variation in lighting within the light extraction face is 1.3%, and in the chip with 900 μm side, the variation is 8.9%.

Also, in the case of the chip with 300 μm side, the overall brightness of the semiconductor light emitting device 111 according to the first example is 1.1 times the overall brightness of the semiconductor light emitting device 191 according to the first comparative example, and is 1.2 times in the case of the chip with 900 μm side.

For both the semiconductor light emitting devices 112 and 192, the same measurements are carried out on chips with 10 nm equivalent circle diameter of the apertures 21 and 16 nm pitch to adjacent apertures 21, and chips with 5 μm equivalent circle diameter of the apertures 21 and 8 μm pitch to adjacent apertures 21. In all cases, the results are the same as the above.

Third Example

A semiconductor light emitting device 113 according to a third example has the same structure as the semiconductor light emitting device 111 according to the first example. Also, a semiconductor light emitting device 193 according to a third comparative example is the same as the semiconductor light emitting device 191 according to the first comparative example.

In the third example, the measurements on the semiconductor light emitting devices 113 and 193 are carried out with a 20 mA current.

In the semiconductor light emitting device 113 according to the third example, in the chip with 300 μm side, the variation in lighting within the light extraction face is 1.1%, and in the chip with 900 μm side, the variation is 3.2%.

In the semiconductor light emitting device 193 according to the third comparative example, in the chip with 300 μm side, the variation in lighting within the light extraction face is 1.6%, and in the chip with 900 μm side, the variation is 4.0%.

Also, in the case of the chip with 300 μm side, the overall brightness of the semiconductor light emitting device 113 according to the third example is 1.02 times the overall brightness of the semiconductor light emitting device 193 according to the third comparative example, and is 1.08 times in the case of the chip with 900 μm side.

For both the semiconductor light emitting devices 113 and 193, the same measurements are carried out on chips with 10 nm equivalent circle diameter of the apertures 21 and 16 nm pitch to adjacent apertures 21, and chips with 5 μm equivalent circle diameter of the apertures 21 and 8 μm pitch to adjacent apertures 21. In all cases, the results are the same as the above.

Figure 7A:
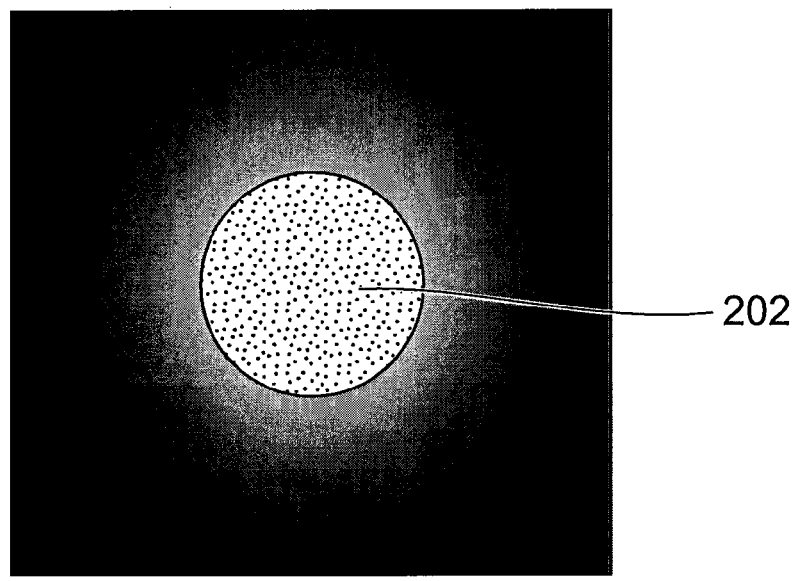
FIGS. 7A and 7B are schematic plan views illustrating light emitting states of the semiconductor light emitting devices
Figure 7B:
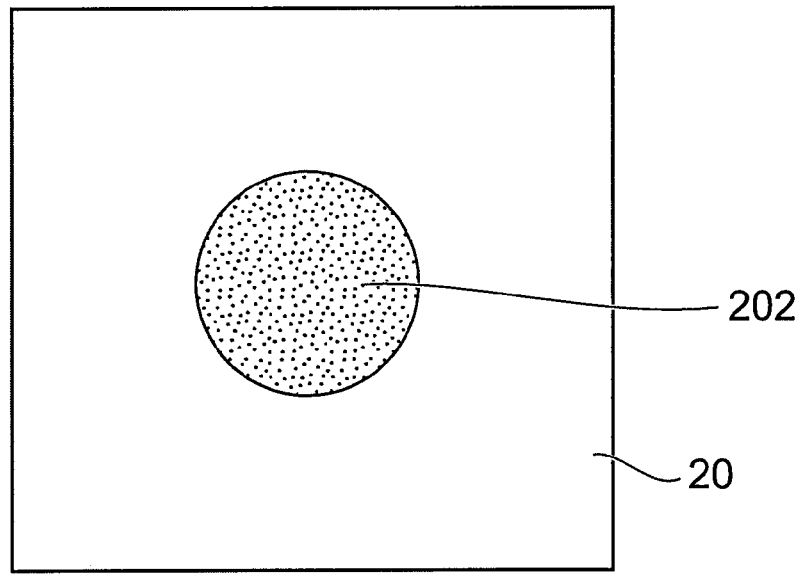

FIGS. 7A and 7B are schematic plan views illustrating examples of light emitting states of semiconductor light emitting devices.

FIG. 7A illustrates the light emitting states of the semiconductor light emitting devices 191, 192, and 193 according to the first to the third comparative examples.

FIG. 7B illustrates the light emitting states of the semiconductor light emitting device 110 according to the first embodiment and semiconductor light emitting devices 111 through 113 according to the first to third examples.

In both illustrations, in the part of the light extraction face apart from the pad electrode 202, the portions with the higher brightness indicate stronger luminous intensity.

As illustrated in FIG. 7A, in semiconductor light emitting devices 191 through 193, the luminous intensity is strong only near the pad electrode 202, and the farther from the pad electrode 202 the weaker the luminous intensity.

On the other hand, as illustrated in FIG. 7B, in the semiconductor light emitting devices 110 and 111 through 113, a uniform luminous intensity is obtained from near the pad electrode 202 to the distant parts.

Fourth Example

Figure 8:
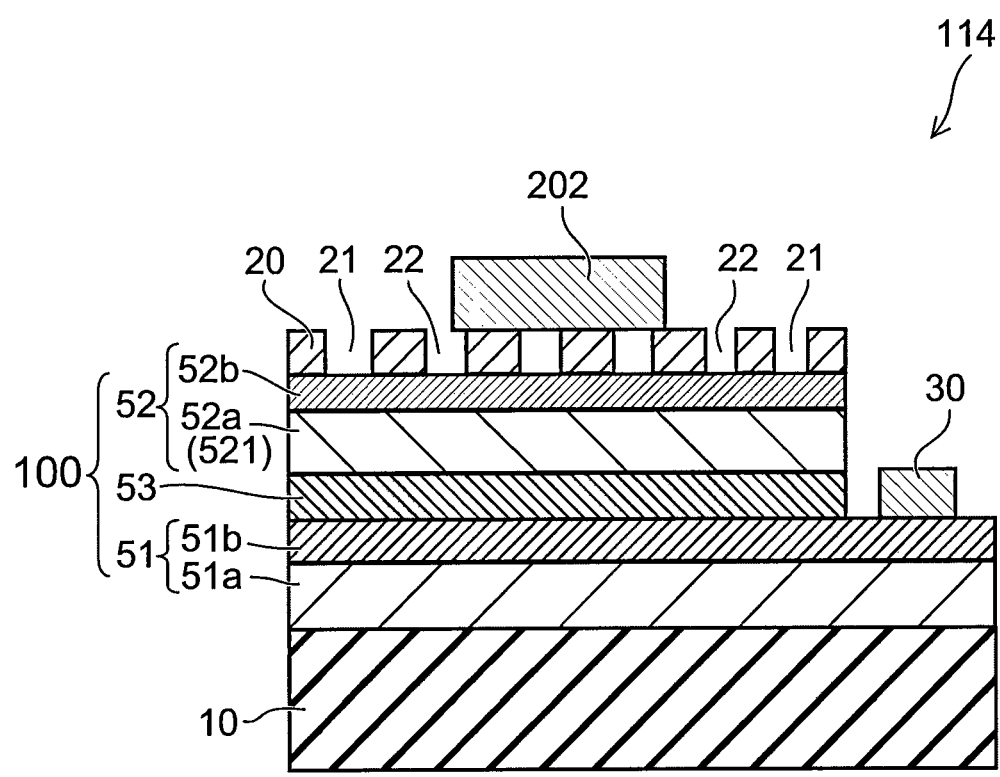
FIG. 8 is a schematic cross-sectional view illustrating other semiconductor light emitting device.

FIG. 8 is a schematic cross-sectional view illustrating a semiconductor light emitting device according to a fourth example.

In a semiconductor light emitting device 114 according to the fourth example, a nitride semiconductor is used as the material of the structure 100.

Specifically, in the semiconductor light emitting device 114, a GaN buffer layer 51a, an Si-doped n-type GaN layer 51b, an InGaN/GaN light emitting layer 53 having a Multi Quantum Well (MQW) construction, a first portion 52a made from an Mg-doped p-type Al$_{0.2}$Ga$_{0.8}$N layer and a second portion 52b made from p-type GaN are formed by, for example, epitaxial growth on a substrate 10, for example a sapphire substrate.

In the semiconductor light emitting device 114 according to the fourth example, for convenience, the GaN buffer layer 51a and n-type GaN layer 51b are included in the first semiconductor layer 51.

The metal layer 20A containing Ag (thickness 50 nm) is formed on the second portion 52b. The Ag film is formed by, for example, the vacuum deposition. Then, the second electrode layer 20 having a plurality of apertures 21 is formed in accordance with the method of using the stamper, the same as for the first example. A different material may be used in the metal layer 20A. Also, the first electrode layer 30 is provided on the part where the second semiconductor layer 52 and a part of the light emitting layer 53 are etched, and the n-type GaN layer 51b is exposed.

In the semiconductor light emitting device 114 according to the fourth example, the thickness of the metal portion 23 of the second electrode layer 20 along the Z-axis direction is 50 nm, the equivalent circle diameter of the apertures 21 is 120 nm, the distance between adjacent apertures 21 is 200 nm, the thickness of the second portion 52b along the Z-axis direction is 300 nm, the concentration of impurities is $1 \times 10^{13}$ cm$^{-3}$, and the height of the Schottky barrier estimated from the voltage-current characteristic is 1.89 eV.

For the semiconductor light emitting device 114, the variation in the lighting within the light extraction face and the brightness are measured. The measurements are carried out on chips having areas of external shape viewed from the Z-axis direction of $9.0 \times 10^{-2}$ mm$^2$ (one side 300 μm) and $8.1 \times 10^{-1}$ mm$^2$ (one side 900 μm). The current is 350 mA.

In the semiconductor light emitting device 114 according to the fourth example, in the chip with 300 μm side, the variation in lighting within the light extraction face is 0.07%, and in the chip with 900 μm side, the variation is 1.1%. In the semiconductor light emitting device 114, by providing the second portion 52b as described above, it is possible to obtain uniform light emission within the light extraction face, so it is possible to obtain high brightness.

For the semiconductor light emitting device 114, the same measurements are carried out on chips with 10 nm equivalent circle diameter of the apertures 21 and 16 nm pitch to adjacent apertures 21, and chips with 5 μm equivalent circle diameter of the apertures 21 and 8 μm pitch to adjacent apertures 21. In all cases, the results are the same as the above.

Fifth Example

In a fifth example, a semiconductor light emitting device 115 is produced with the same structure as the first example, having the second electrode layer 20 with the apertures 21 produced using electron beam lithography. In this semiconductor light emitting device 115, the same characteristics are obtained as Example 1.

Sixth Example

In a sixth example, semiconductor light emitting devices 116 are produced with the same structure as the first example, using one of AlGaAs, GaAsP, and GaP as the light emitting layer 53. In the semiconductor light emitting devices 116 which use one of AlGaAs, GaAsP, and GaP as the light emitting layer 53, the same characteristics are also obtained as Example 1.

Figure 9A:
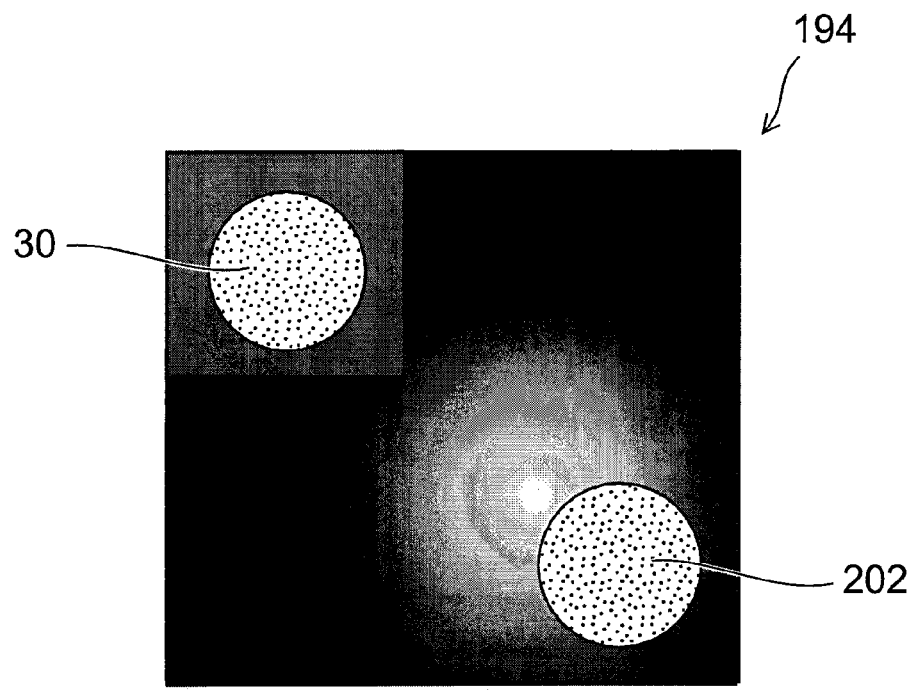
FIGS. 9A and 9B are schematic plan views illustrating light emitting states of other semiconductor light emitting devices.
Figure 9B:
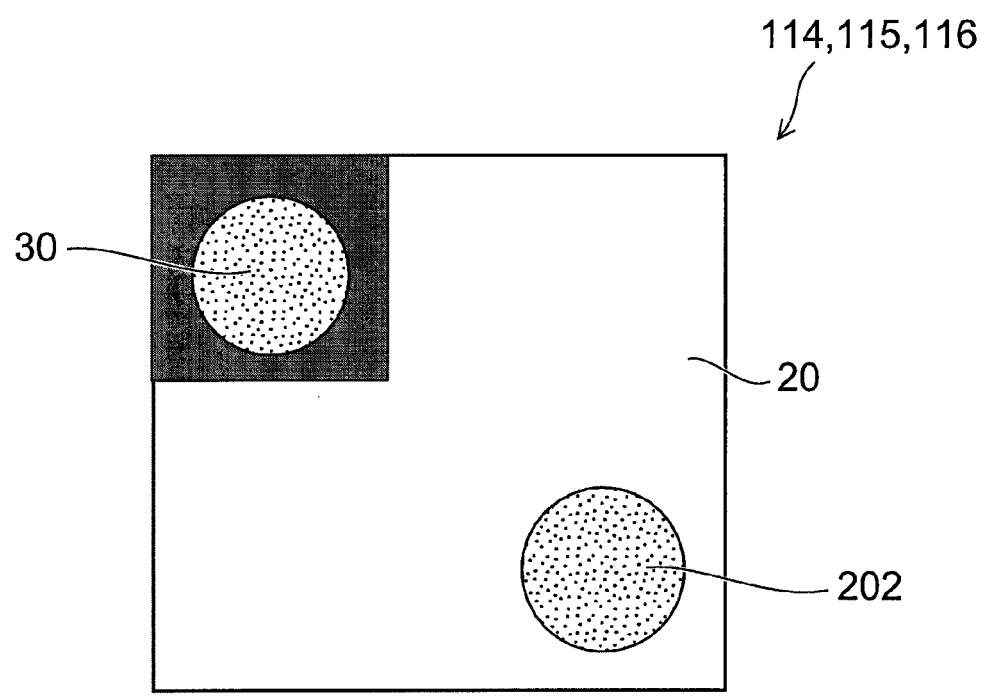

FIGS. 9A and 9B are schematic plan views illustrating examples of light emitting states of semiconductor light emitting devices.

FIG. 9A illustrates the light emitting state of a semiconductor light emitting device 194 in which the sheet resistance value of the third semiconductor layer 54 is lower than that of the semiconductor light emitting devices 114 through 116 according to the fourth to the sixth examples.

FIG. 9B illustrates the light emitting state of the semiconductor light emitting devices 114 through 116 according to the fourth to the sixth examples.

In both illustrations, in the part of the light extraction face apart from the pad electrode 202, the portions with the higher brightness indicate stronger luminous intensity.

As illustrated in FIG. 9A, in semiconductor light emitting device 194, the luminous intensity is strong only near the pad electrode 202, and the farther from the pad electrode 202 the weaker the luminous intensity.

On the other hand, as illustrated in FIG. 9B, in the semiconductor light emitting devices 114 through 116, a uniform luminous intensity is obtained from near the pad electrode 202 to distant parts.

The embodiments have been described above, but the invention is not limited to these examples. For example, a plurality of apertures 21 may be provided on the first electrode layer 30 provided on the front face or the reverse face of the structure 100, similar to the second electrode layer 20. Also, in the explanation the first conductivity type is n-type, and the second conductivity type is p-type, but first conductivity type may be p-type, and the second conductivity type may be n-type.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

As explained above, according to the semiconductor light emitting device and manufacturing method of this embodiment, it is possible to obtain uniform light emission in-plane by a uniform spread of current to the semiconductor layers.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor light emitting device, comprising:
    forming a structure including a first semiconductor layer of a first conductivity type, a light emitting layer provided on the first semiconductor layer, and a second semiconductor layer of a second conductivity type, the second semiconductor layer being provided on the light emitting layer;
    forming a metal layer on the second semiconductor layer with a thickness not less than 10 nanometers and not more than 100 nanometers along a direction from the first semiconductor layer toward the second semiconductor layer, a Schottky barrier being formed between the metal layer and the second semiconductor layer;
    forming a mask pattern on the metal layer; and
    forming an electrode layer having a plurality of apertures with equivalent circle diameters not less than 10 nanometers and not more than 5 micrometers when viewed along the direction by etching the metal layer using the mask pattern as a mask, a conductive member being not provided in each of the apertures, a first region of the second semiconductor layer physically contacting the electrode layer, a second region of the second semiconductor layer overlapping the apertures in the first direction, wherein the second semiconductor layer includes a first portion and a second portion provided between the first portion and the electrode layer, an impurity concentration of the second portion is not less than $1\times10^{12}$/cubic centimeter and not more than $1\times10^{18}$/cubic centimeter, the metal layer includes at least one of Au and Ag, and a sheet resistance of the electrode layer is not more than 10 ohms/square.

2. The method according to claim 1, wherein the forming of the mask pattern comprises:

forming a resist film on the metal layer; and forming a plurality of recesses in the resist film by pressing protrusions into the resist film using a stamper having the protrusions.

3. The method according to claim 1, wherein the forming of the mask pattern comprises:

applying a compound including a block copolymer onto the metal layer; and generating a microdomain pattern by phase separation of the block copolymer.

4. The method according to claim 1, wherein a thickness of the metal layer along the direction is not less than 10 nanometers and not more than 50 nanometers.

5. The method according to claim 1, wherein the Schottky barrier is greater than 0.3 eV and less than 2.0 eV.

6. The method according to claim 1, wherein the equivalent circle diameter of the apertures is not more than 0.9 times the distance between adjacent apertures.

7. The method according to claim 1, wherein an impurity concentration of the first portion is not less than $1\times10^{16}$/cubic centimeter and less than $3\times10^{18}$/cubic centimeter.

8. The method according to claim 1, wherein reflectance of the electrode layer is not less than 70% with respect to a wavelength of light emitted from the light emitting layer.

9. The method according to claim 1, wherein the equivalent circle diameter of the apertures is not less than 10 nanometers and not more than 360 nanometers.

10. The method according to claim 1, wherein the electrode layer and the second semiconductor layer are configured to make a current to pass the Schottky barrier.

11. The method according to claim 1, wherein a current to pass the Schottky barrier is larger than a current to flow the second region.

12. The method according to claim 1, wherein the light emitting layer has a Multiple Quantum Well (MQW) construction or a Single Quantum Well (SQW) construction.

* * * * *